(12) United States Patent
Sato et al.

(10) Patent No.: US 6,333,211 B1
(45) Date of Patent: Dec. 25, 2001

(54) PROCESS FOR MANUFACTURING A PREMOLD TYPE SEMICONDUCTOR PACKAGE USING SUPPORT PINS IN THE MOLD AND EXTERNAL CONNECTOR BUMPS

(75) Inventors: Takeshi Sato; Hiromi Tokunaga; Kenichi Sakaguchi, all of Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/383,577

(22) Filed: Aug. 25, 1999

(30) Foreign Application Priority Data

Aug. 26, 1998 (JP) .................................................. 10-239873

(51) Int. Cl.[7] .......................... H01L 21/44; H01L 21/48; H01L 21/50
(52) U.S. Cl. .......................... 438/126; 438/123; 438/124; 438/127; 257/676
(58) Field of Search .................................... 438/116, 121, 438/123, 124, 127, 112, 126; 257/737, 738, 787, 778, 666, 780, 673, 676, 774; 264/272.17

(56) References Cited

U.S. PATENT DOCUMENTS

| | | | |
|---|---|---|---|
| 4,663,833 | * 5/1987 | Tanaka et al. | 438/65 |
| 5,293,072 | * 3/1994 | Tsuji et al. | 257/737 |
| 5,302,849 | * 4/1994 | Cavasin | 257/666 |
| 5,508,556 | * 4/1996 | Lin | 257/691 |
| 5,856,212 | * 1/1999 | Chun | 438/126 |
| 5,869,883 | * 2/1999 | Mehringer et al. | 257/667 |
| 5,893,724 | * 4/1999 | Chakravorty et al. | 438/108 |
| 5,914,531 | * 6/1999 | Tsunoda et al. | 257/668 |
| 5,985,695 | * 11/1999 | Freyman et al. | 438/112 |
| 6,020,218 | * 2/2000 | Shim et al. | 438/111 |
| 6,027,791 | * 2/2000 | Higashi et al. | 428/209 |

FOREIGN PATENT DOCUMENTS

| | | |
|---|---|---|
| A-1-99245 | 4/1989 | (JP) . |
| A-5-283460 | 10/1993 | (JP) . |
| A-8-83878 | 3/1996 | (JP) . |
| A-287041 | 11/1998 | (JP) . |

* cited by examiner

Primary Examiner—Carl Whitehead, Jr.
Assistant Examiner—Jamie L. Brophy
(74) Attorney, Agent, or Firm—Pennie & Edmonds LLP

(57) ABSTRACT

A premold type semiconductor package includes a plurality of leads arranged side by side and having upper and lower common surfaces, a mold resin integrally molded with the leads for securing them from the upper and lower surfaces thereof. The mold resin defines a chip mounting recess at an upper side on the first surfaces of the leads, so that a semiconductor chip is to be mounted in the recess. The upper surfaces of the leads are partially exposed in the recess so as to define internal connecting terminals to which the semiconductor chip is to be electrically connected. The mold resin is provided with a plurality of holes by which the lower surfaces of the leads are partially exposed to define external connecting terminals.

4 Claims, 4 Drawing Sheets

PROCESS FOR MANUFACTURING A PREMOLD TYPE SEMICONDUCTOR PACKAGE USING SUPPORT PINS IN THE MOLD AND EXTERNAL CONNECTOR BUMPS

BACKGROUND OF THE INVENTION

1. Field of the Invention

The present invention relates to a package for a resin-shield type semiconductor device, particularly a premold type semiconductor package, and a process for producting the same.

2. Description of the Related Art

In general, the resin-shield type semiconductor device is produced by mounting a semiconductor chip in a chip-mounting area of a lead frame, then electrically connecting the semiconductor chip to leads by wires, and thereafter, shielding the semiconductor chip with resin.

Alternatively, there is a so-called premold type package wherein a molded body having a recessed chip-mounting area is preliminarily formed by an insert molding of a lead frame. According to this package, a semiconductor chip is mounted in the chip-mounting area, then circuit patterns around the chip-mounting area are electrically connected to the semiconductor chip, and thereafter, the chip-mounting area is covered with a lid, resulting in a semiconductor device.

Nowadays, the latter package of a simple structure has been widely employed in various uses because it is improved in air-tightness due to the advancement of a passivation film on the semiconductor chip itself and/or an adhesive for sealing between the lid and the molded package.

FIG. 5 illustrates a diagrammatic sectional view of the latter package wherein reference numerals 10 and 12 denote a lead frame and a molded body, respectively. This package is provided as a package in which the lead frame 10 is integral with the molded body 12. A semiconductor chip 16 is mounted in a recessed chip-mounting area 14, and electrically connected to the lead frame 10 by wires 18. Then, the chip-mounting area 14 is covered by a lid 20 which is bonded with an adhesive 25 to shield the semiconductor chip 16. The resultant assembly is used as a DIP type or gull-wing type semiconductor device.

The prior art package wherein the lead frame is used, however, has the following problems:

Although the package of this type is simple in structure, it necessitates a process for removing a dam bar (not shown) which is provided for preventing resin from flowing into the spaces between adjacent leads, after the molded body 12 has been molded by a transfer or injection molding process, and further removing resinous flash flowing into spaces between adjacent lead portions extending to the dam bar as in a conventional resin-shield type semiconductor device. This makes the production thereof troublesome.

In addition, a die for cutting the dam bar is expensive and requires a long manufacturing time to result in the increase of the package production cost.

Also, while external leads 10b must be subjected to a forming process to be of a DIP type or a gull-wing type, a die used for such forming is expensive, which is one of factors of the increase of package production cost.

When handling the package for the purpose, for example, of transportation after the external leads 10b have been formed to have a predetermined shape, the external lead 10b is liable to deform because it is supported in a cantilever manner, which is one of factors in a short-circuit accident.

Further, since the external leads 10b extend outward from a body of the package, a total size of the package becomes larger by the length of the external leads 10b, which does not satisfy the requirement for compactness.

On the other hand, a semiconductor device is disclosed in a prior patent application of the present Applicant (Japanese Unexamined Patent Publication No. 5-283460), wherein a base film 50 provided with circuit patterns (lead patterns 52) on the upper surface of a film-like resin substrate is used for compacting the package. That is, as shown in FIG. 6, the lead patterns 52 are provided on the upper surface of the insulating base film 50 and through-holes 54 are provided in the base film 50 so that intermediate portions of the lead pattern 52 are exposed from the base film 50, wherein solder bumps 56 are formed to be projected downward from the exposed lead patterns 52 through the base film 50. Thereby, it is possible to connect the lead patterns 52 with connector pads on the substrate via the solder bumps 56 without the external leads. Thus, the semiconductor device can be smaller in size.

This prior art invention, however, has been made on the premise that the base film 50 is used and the resin-molding is not carried out, which means that a lead frame and a resin-molding technology capable of forming desirable circuit patterns in a stable manner at a lower cost is not usable.

SUMMARY OF THE INVENTION

An object of the present invention is to provide a premold type package for a semiconductor device and a process for producing the same, wherein a lead frame is suitably used so that the package is easily and reliably produced in a stable manner at a lower manufacturing cost.

Another object of the present invention is to solve the above-mentioned problems in the prior art under such circumstances.

According to the present invention, there is provided a premold type semiconductor package comprising: a plurality of leads arranged side by side and having first and second common surfaces; a mold resin integrally molded with the leads for securing them from the first and second surfaces thereof; the mold resin defining a chip mounting recess at a first side on the first surfaces of the leads, so that a semiconductor chip is to be mounted in the recess; the first surfaces of the leads being partially exposed in the recess so as to define internal connecting terminals to which the semiconductor chip is to be electrically connected; and the mold resin provided with a plurality of holes by which the second surfaces of the leads are partially exposed to define external connecting terminals.

The mold resin has substantially a rectangular shape and the chip mounting recess is located at a central area of the mold resin at the first side thereof. Each of the leads extends from an outer periphery of the mold resin to the recess so that the first surface of the lead is exposed at an inner end thereof in the recess.

An outer end of the lead is covered with electrically insulating material.

A stage, made of same material as the leads and on which a semiconductor chip is to be mounted, is provided at a central area of the chip mounting recess, so that the inner end of the leads are arranged adjacent to a periphery of the stage.

Each of the holes has a tapered shape, a diameter thereof being gradually increased toward a surface of the mold resin.

Each of the holes is filled with electrically conducting material to contact with the external connecting terminal to define an external connecting bump.

According to another aspect of the present invention, there is provided a process for manufacturing a premold type semiconductor package comprising the following steps of:

inserting a lead frame between first and second molds at their open position, the first and second molds having recesses which cooperatingly define a cavity therebetween when they are in their closed position, the first mold having a protruded portion which is in contact with a first surface of the lead frame in a closed position, and the second mold having a plurality of pins projected into the cavity, the pins being in contact with a second surface of the lead frame in the closed position;

bringing the first and second molds to their closed position so that the lead frame is nipped therebetween;

injecting resin into the cavity to form a mold resin integrally molded with the leads; and cutting respective leads of the lead frame extending outward from the mold resin;

whereby obtaining a package comprising: a plurality of leads cut off from the lead frame, the mold resin integrally molded with the leads, the mold resin defining a chip mounting recess on first surfaces of the leads formed by the protruded portion and provided with a plurality of holes formed by the plurality of pins to define external connecting terminals of the leads.

A step may further comprise: forming bumps on the external connecting terminals by filling the plurality of holes with electrically conducting material.

A step may further comprise: covering outer ends of the leads with electrically insulating material.

Each of the pins is a tapered pin so that the hole of the package has a tapered shape, a diameter thereof being gradually increased toward a surface of the mold resin.

DETAILED DESCRIPTION OF THE EMBODIMENTS

Best modes for carrying out the present invention will be described below in detail with reference to the attached drawings.

Figure 1A:
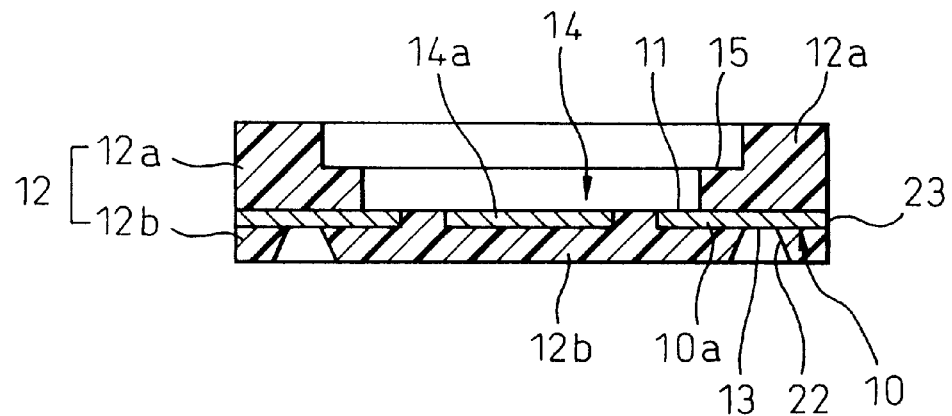
FIG. 1(*a*) is a sectional view of one embodiment of a package for a semiconductor device according to the present invention, and FIG. 1(*b*) is a plan view of a lead frame used in the package of the present invention.
Figure 1B:
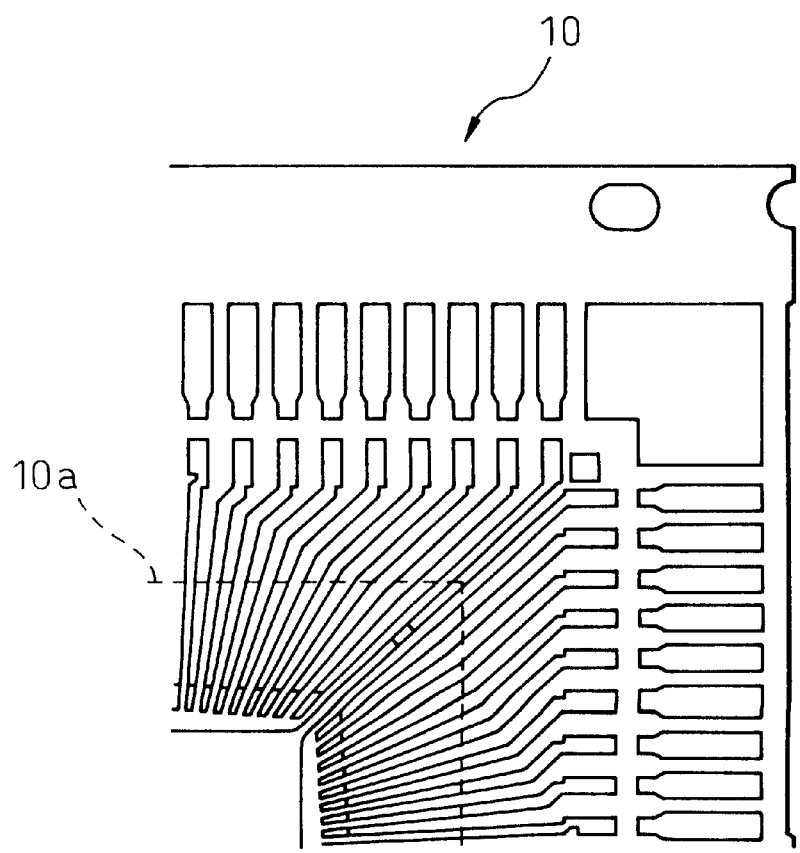
Figure 2A:
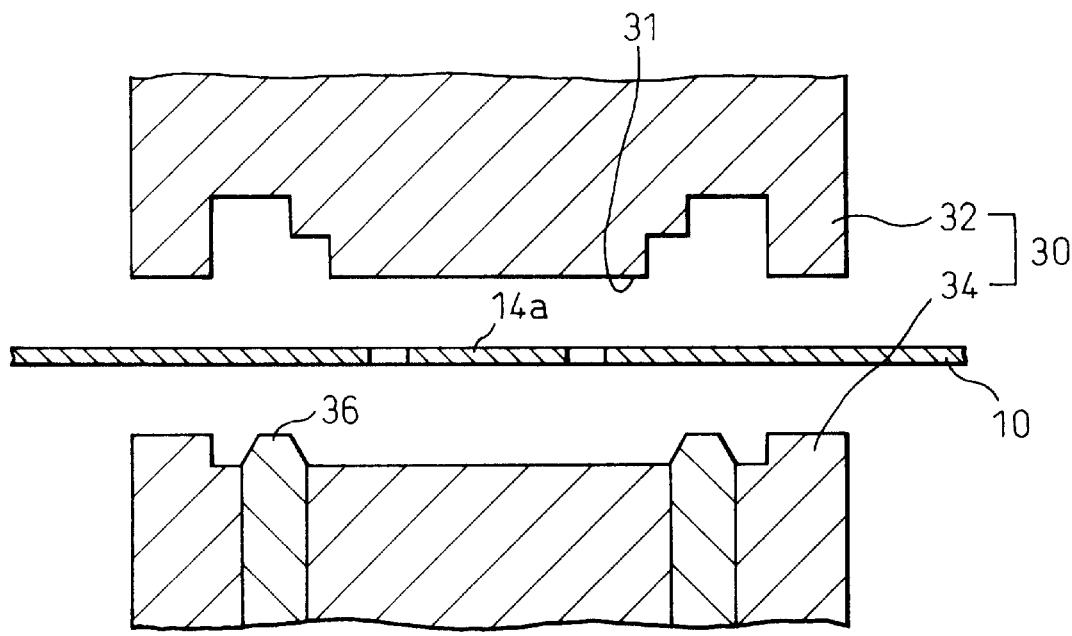
FIGS. 2(*a*) and 2(*b*) are sectional views showing a molding process using a mold assembly of the present invention, respectively.

FIG. 1 is a sectional view for illustrating one embodiment of a package for a semiconductor device, and FIG. 2 is a sectional view for illustrating a mold assembly.

Reference numeral 10 denotes a lead frame, internal leads 10*a* of which are fixed by a molded body 12 provided on opposite sides of the lead frame 10 by a resin-molding. The internal leads 10*a* are portions of lead arranged side-by-side in the package for a semiconductor device and connecting the semiconductor chip to a member to be electrically connected thereto, such as an external circuit board. Reference numeral 14 denotes a chip-mounting area centrally provided in the upper surface defining one of opposite surfaces of the lead frame 10. Reference numeral 14*a* denotes a stage formed as part of the lead frame 10 and defining a chip-mounting surface of the chip-mounting area 14 by its upper surface.

Reference numeral 12*a* denotes an upper molded section constituting one of the molded sections, provided on one side of the lead frame. The upper molded section 12*a* is formed to encircle the chip-mounting area 14 so that the chip-mounting area 14 is constituted as a bottom of a recess. Also, part of the upper surface of the internal lead 10*a* which defines an internal connector terminal 11 to be electrically connected to the semiconductor chip is exposed in the recess. The part defining the internal connector terminal 11 in this embodiment is an inner end of the internal lead 10*a*.

The upper molded section 12*a* of this embodiment is formed to be of a rectangular frame shape having a shoulder for securing a lid along the inner periphery of the upper side thereof. The lid is bonded to the shoulder 15 via an adhesive.

In this regard, if a wider adhesion area is required for securing the lid, the shoulder 15 may be eliminated so that the entire upper surface of the molded section 12*a* is used as a lid-securing region.

Reference numeral 12*b* denotes a lower molded section provided on the other side of the lead frame 10. In the lower molded section 12*b*, a hole 22 is formed to expose part of the lower surface of the internal lead 10*a* defining an external connector terminal 13.

As described later, a bump such as a solder ball may be formed on the external connector terminal 13. By the formation of the bump, the connection to the external circuit is enhanced.

When the semiconductor device using the package according to the present invention is mounted onto a circuit board by providing bumps on the circuit pattern of a substrate, it is unnecessary to form bumps on the above-mentioned external connector terminals.

Reference numeral 23 denotes a cut surface on which an outer end of the internal lead 10*a* is exposed outside as a result of cutting off the external lead of the lead frame 10 along the contour of the molded body 12.

This cut surface 23 may be shielded with electro-insulating material in a post process. Thereby, the insulation ability is improved to facilitate the reliability of the product.

Next, an embodiment a mold assembly for producing a package for a semiconductor device according to the present invention will be explained based on FIG. 2, wherein 2(*a*) is a sectional view of the mold assembly in an open state, and 2(*b*) is a sectional view of the mold assembly in a closed state.

An upper mold 32 and a lower mold 34 are mated with each other to form a mold assembly. It is possible to provide the molded body 12 on both sides of the lead frame 10 by the insert-molding wherein the lead frame 10 is inserted in the mold assembly 30 consisting of the upper and lower molds 32 and 34 and resin-molding is carried out in the mold assembly.

Figure 2B:
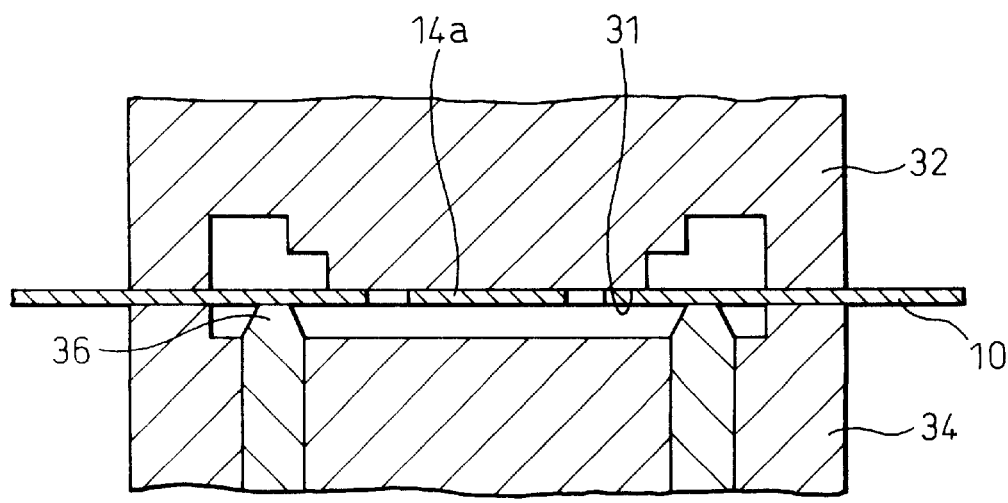

The upper mold 32 has a contact region 31 to be in contact with part of the upper surface of the internal lead 10a (inner end of the lead) so that the upper molded section 12a encircles the chip-mounting area 14 while at least a portion of the upper surface of the internal lead 10a is exposed to form the internal connector terminal 11 to be electrically connected to the semiconductor chip, as shown in FIG. 1. Also, in this embodiment, the lower surface of the upper mold 32 (contact region 31) is in contact with the surface of the stage 14a so that the upper surface of the stage 14a of the lead frame 10 is exposed in the package for a semiconductor device, as shown in FIG. 2(b).

Figure 5:
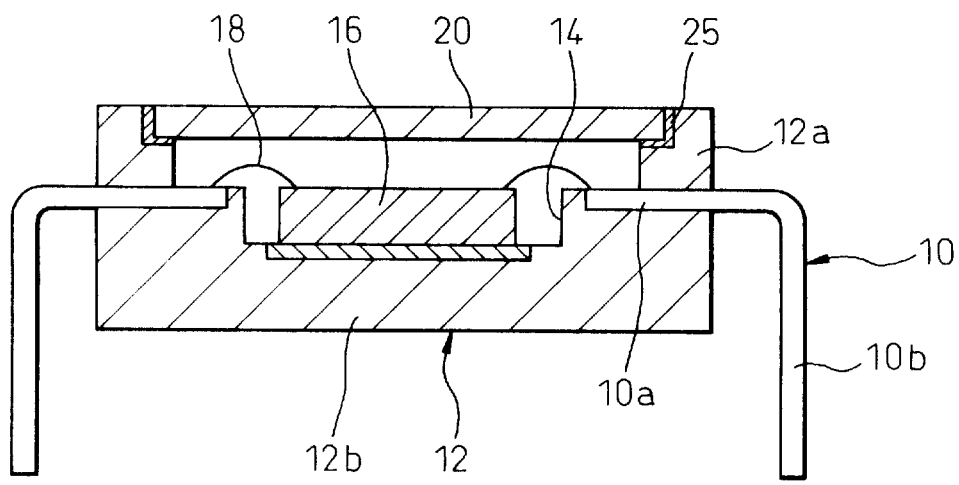
FIG. 5 is a sectional view of a premold type prior art package.
Figure 6:
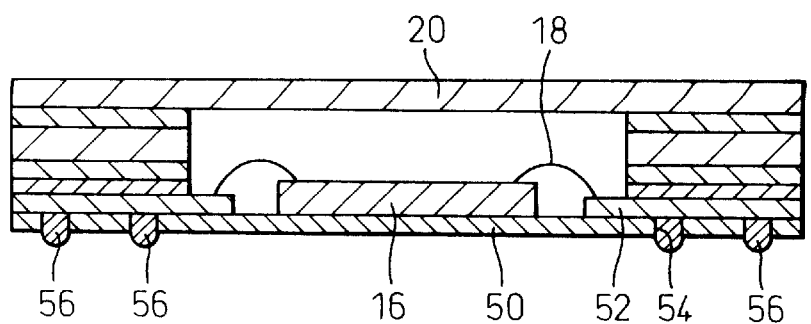
FIG. 6 is a sectional view of another type prior art package.

Note the stage 14a may be either flush with a plane of the internal lead 10a as in this embodiment or formed in a lower level as in the prior art shown in FIG. 5. Moreover, the stage 14a may be eliminated, and instead, the upper surface of the lower molded section 12b may be used as the chip-mounting area or the semiconductor chip may be mounted via a metallic heat sink provided separately from the stage 14a.

The lower mold 34 has a region to be in contact with part of the lower surface of the internal lead 10a so that the hole 22 (see FIG. 1) is formed in the lower molded section 12b to expose part of the lower surface of the internal lead 10a in the inner bottom so that the external connector terminal is defined. Thereby, it is possible to insert the lead frame 10 into the mold assembly 30 while nipping the internal lead 10a between the upper and lower molds 32 and 34.

Reference numeral 36 denotes a support pin which is one aspect of the region in the lower mold 34 to be in contact with part of the lower surface of the internal lead 10a. This support pin 36 is brought into contact with the lower surface of the internal lead 10a while the lead frame 10 is inserted into the mold assembly 30 and the resin-molding is carried out, and serves to support the lead frame 10 in a cavity of the mold assembly 30. A plurality of support pins 36 are provided in correspondence to the number of holes 22 described above which in turn corresponds to that of the internal leads 10a. Thereby, it is possible to easily and reliably provide the external connector terminals 13.

The support pin 36 has a tapering cross-sectional shape and therefore the hole 22 has the smallest diameter on the top thereof which gradually increases toward the lower surface of the lower molded section 12b. Accordingly, it is possible to easily and reliably apply a solder ball thereto to form a bump on the external connector terminal 13.

The support pin 36 may be formed separately from the lower mold 34 and embedded and fixed in the lower mold 34 thereafter. Provision of the support pin 36 in the lower mold 34 facilitates accurate production and lowers the manufacturing cost.

Note the hole 22 may be formed not only by a resin-molding but also by removing part of the molded section with a laser beam or etching.

Next, a process for producing a package for a semiconductor device according to the present invention will be described in detail with reference to FIGS. 2(a), 2(b), and 3(a)–3(c).

Figure 3A:
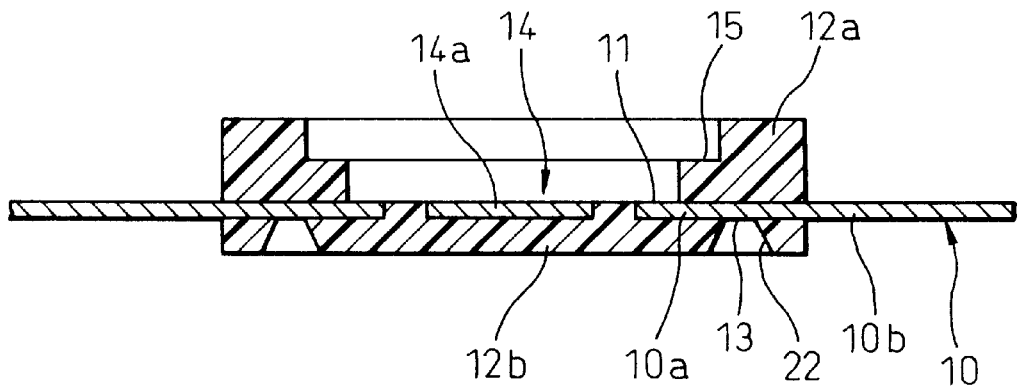
FIGS. 3(*a*) to 3(*c*) are sectional views for illustrating one embodiment of a production process according to the present invention.
Figure 3B:
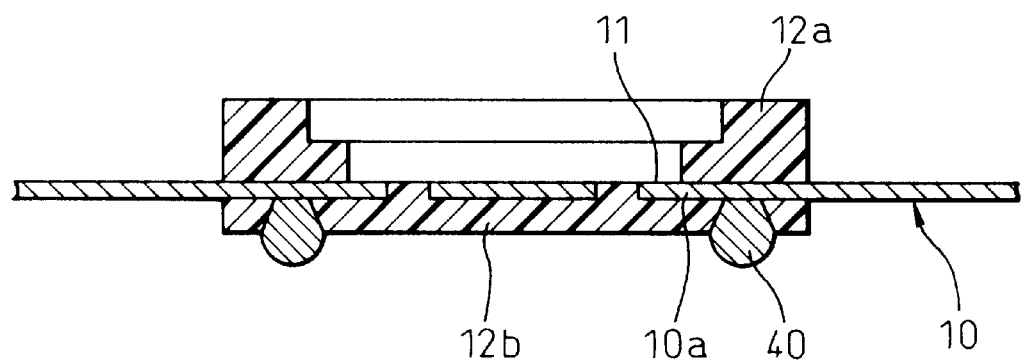

FIG. 3(a) illustrates a state wherein the lead frame 10 is inserted into the mold assembly 30 formed of the upper mold 32 and the lower mold 34 to define a cavity and the molded portion 12 is provided on both sides of the lead frame 10 by a resin-molding process to fix the internal lead 10a in the molded portion 12.

In this regard, usually, the lower mold 34 is stationary and the upper mold 32 is movable upward and downward so that an object to be molded is nipped between the lower mold 34 and the upper mold 32. Also, in this embodiment, the molded portion 12 is formed by the steps of setting the lead frame 10 on the surface of the lower mold 34, nipping the lead frame 10 between the upper and lower molds by moving the upper mold 32 downward and carrying out the resin-molding. That is, after the external lead 10b is nipped between the peripheral regions of the upper mold 32 and the lower mold 34 defining the cavity, so that the lead frame 10 is fixed, the resin molding is carried out.

When the resin-molding is carried out after the lead frame 10 is set, a predetermined portion (contact region 31) of the upper mold 32 is in contact with a portion which is part of the upper surface of the internal lead 10a defining the internal connector terminal 11 and the stage 14a.

Simultaneously therewith, upper end surfaces of the plurality of support pins 36 provided in the lower mold 34 are in contact the lower surface of an intermediate region of the respective internal leads 10a corresponding thereto.

Thereby, it is possible to insert the lead frame 10 into the mold assembly 30 while nipping the external lead 10b as well as the internal lead 10a between the upper and lower molds 32, 34.

Then, while maintaining the state wherein the lead frame 10 is inserted into the mold assembly 30, the resin-molding is carried out in the cavity defined in the mold assembly 30 by the upper and lower molds.

For example, the molded body 12 is molded with thermosetting resin by the injection process or the transfer process.

Accordingly, the upper molded section 12a is formed while encircling the chip-mounting area 14 on which the semiconductor chip is to be mounted, so that a recessed cavity is defined. Simultaneously therewith, the internal connector terminal 11 to be electrically connected to the semiconductor chip is exposed at a predetermined position of the upper surface of the internal lead 10a.

The holes 22 are opened in the lower mold 12b to expose part of the lower surface of the internal lead 10a so that the external connector terminal 13 is defined.

That is, since the liquefied resin could not reach a region of the upper surface of the internal lead 10a with which the upper mold 32 is directly in contact during the molding, that region defines an externally exposed surface (terminal surface of the internal connector terminal 11; the upper surface of the stage 14a). On the other hand, since the liquefied resin could not reach a region of the lower surface of the internal lead 10a with which the upper surface of the support pin 36 is directly in contact during the molding, that region also defines an externally exposed surface (terminal surface of the external connector terminal 13). The internal lead 10a is nipped from the both sides in the thickness direction between the predetermined positions of the upper and lower molds 32, 34, and fixedly held in the cavity of the mold assembly 30. Thus, the exposed regions are properly and assuredly formed on the both sides of the internal lead 10a.

Next, a plating process and a process for forming bumps of solder balls will be described below.

First, the remaining contaminants which have been stuck onto the surface during molding are removed by surface-rinsing.

Then, a plating is applied to portions of the surface of the lead frame 10 to be exposed. In this embodiment, the plating is applied to all the surfaces to be exposed of the internal connector terminals 11, the stage 14a and the external connector terminals 13. Usually, the lead frame 10 is made of iron type alloy (such as 42-alloy) or copper type alloy, on which nickel is plated and Au is plated thereon, for example. The plating is preferably an electroplating while using the lead frame 10 as an electrode.

Needless to say, a plated layer may be formed on the required portions of the lead frame in advance of the resin-molding.

If there is a risk of an adverse effect on the plated layer due to outgassing during the molding, a light rinsing is favorable.

The plated layer is preferably formed, for example, by forming a ground plated layer of nickel (Ni) on which is then plated palladium (Pd), and a thin gold (Au) layer is plated thereon.

After the completion of the plating process, a flux is coated on the external connector terminals 13 and solder balls are placed thereon. The solder is heated to reflow and is electrically connected and fixed to the external connector terminals 13 of the internal leads 10a. A surface rinsing is carried out after the reflow to remove the remaining flux.

By the processes described above, it is possible to easily and properly form external connector bumps 40, parts of which are projected out of the respective holes 22 for the external connector terminals 13. By means of these bumps 40, surface-mounting of the package to an external circuit board is facilitated.

Note that the external connector terminals 40 may be formed by another process than the above, including, for example, one wherein a solder paste and core balls may be used.

This process for forming the bumps could be carried out by means of an inexpensive installation in comparison with the conventional dam-cutting process or external lead-forming process and therefore largely decreases the manufacturing cost. That is, the dam-cutting or external lead-forming requires expensive dies of various types in correspondence to the kinds of packages to be produced. On the contrary, the above-mentioned bump-forming process solely requires a ball-attaching device for disposing solder balls at predetermined positions and a solder reflow device which are commonly usable for packages of various sizes, and does not need expensive dies.

Next, the external leads 10b of the lead frame 10 are cut off along the contour of the molded body 12 to obtain a package for a semiconductor device. A fine cutting operation as in the dam-cutting is unnecessary in this process and merely needs an extremely simple die capable of cutting a number of external leads 10b at once. Accordingly, no expensive devices or dies are needed to lower the manufacturing cost.

Figure 3C:
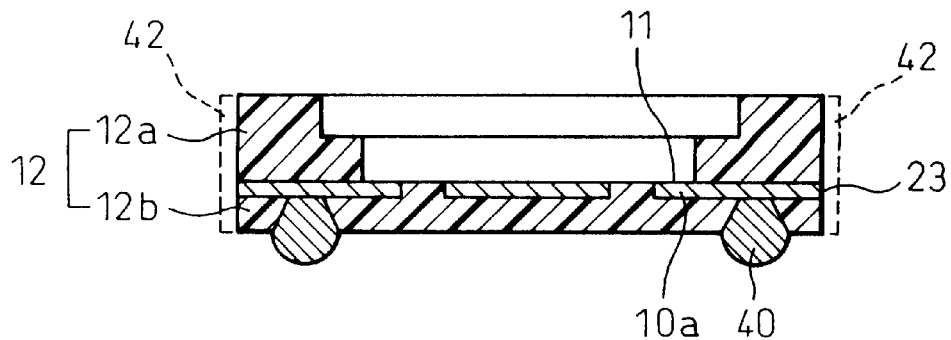

In addition, the cut surface 23 forming the outer end of the internal lead 10a exposed outside by the cutting of the external lead 10b is shielded with an electro-insulating material 42 to result in a more reliable package for a semiconductor device, such as shown in FIG. 3(c). Such a shield 42 can be made by coating and curing an appropriate resin, such as polyimide or epoxy resin, or forming these resin by potting and curing.

A semiconductor chip is placed in the chip-mounting area 14 and electrically connected to the internal leads 10a by wires, and thereafter the chip-mounting area 14 is covered with a lid to shield the semiconductor chip to complete a semiconductor device. The lid is made, for example, of resin or transparent glass and bonded to the upper molded section 12a by an adhesive.

In such a manner, the package for a semiconductor device according to the present invention is suitably used as a premold type package (hollow package).

In this regard, a potting resin (not shown) may be filled in the cavity of the package defined by the upper molded section 12a to shield the semiconductor chip 16.

As is apparent from the above-mentioned description, it is possible to incorporate the bumps 40 within a plane of a definite area wherein the internal leads 10a are arranged, according to the package for a semiconductor device according to the present invention. Accordingly, it is apparent that the area in which the external leads 10b are to be provided is reduced to minimize the total size of the package in comparison with a conventional type package wherein the external leads 10b are formed to have a predetermined shape. Also, it is possible to improve the electric properties because the self-inductance becomes smaller due to the shortening of the circuit pattern of the lead frame 10.

Existing standard lead frames may be used as they are, and the molding process corresponding to the lead frame may be used for producing the package. Thereby, it is also possible to use production facilities corresponding to the existing lead frame, and to reduce the initial investment.

Similar to the conventional process using the lead frame, it is possible to employ a production process wherein the work is carried out while maintaining the connection between a plurality of patterns and finally to cut the resultant integral product into individual packages, so that the production efficiency is enhanced.

The internal lead 10a is held in the mold assembly 30 while being nipped in the thickness direction from the both sides of the lead frame 10. Accordingly, it is possible to assuredly maintain the contact between the upper surface of the internal lead 10a and the lower surface of the upper mold 32 and between the lower surface of the internal lead 10a and the upper surface of the support pin 36. Thus, the formation of fin or film of resin (resinous flash) on the surface to be exposed is avoidable. Thereby, the process for removing the resinous flash prior to the plating process becomes unnecessary to enhance the production efficiency.

Next, another embodiment of the present invention will be described based on FIG. 4, wherein the same reference numerals are used for denoting the same or similar parts as in the preceding embodiment and the explanation thereof will be eliminated.

Reference numeral 37 denotes an upper surface hole provided in an upper molded section 12a so that part of the upper surface of an internal lead 10a is exposed on the bottom surface to define a terminal 38. The terminal 38 may be used for the inspection. The upper surface hole 37 is formed by a pin-like projection provided in an upper mold 32 as in the hole 22 described before. The pin-like projection is disposed opposite to the support pin 36 to form the upper and lower holes 37 and 22 as shown in FIG. 4, whereby the internal lead 10a is assuredly nipped to result in the stable production.

Figure 4:
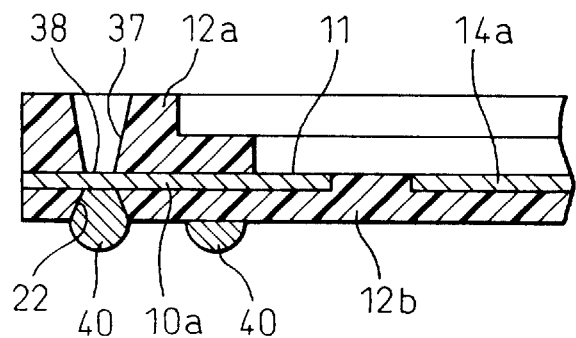
FIG. 4 is a sectional view of another embodiment of a package for a semiconductor device according to the present invention.

The bumps 40 may be arranged in a plurality of rows as illustrated in FIG. 4.

While all the external leads 10b are cut off in the preceding embodiments, part of the external leads 10b may be left as they are so that both of the bumps 40 and the external leads 10b are used for surface-mounting the semiconductor device.

If the bumps 40 and the external leads 10b are used together in such a manner, it is possible to increase the number of connector terminals as well as to improve the heat-dissipation ability.

Although no reference has been made on the arrangement of bumps in the preceding embodiments, it is needless to say that various arrangements may be adopted if desired. For example, the bumps may be arranged linearly in two rows, or along the peripheral edge of a rectangular molded body, or in a matrix manner while effectively using a flat area of the molded body. Also, a contour of the internal lead may be suitably designed to conform with the arrangement.

As described hereinbefore, according to the present invention, a hole is provided in a lower molded section, for exposing part of the lower surface of a lead defining an external connector terminal, and an outer end portion of the lead is cut off along the contour of the molded body.

Thereby, according to the present invention, it is possible to easily and stably produce a reliable package of a premold type for a semiconductor device at a lower manufacturing cost while suitably using a lead frame.

The present invention has been described in detail with reference to the preferred embodiments. It should be noted that the present invention is restricted to those embodiments but may include various changes and modifications without departing from a spirit of the present invention.

What is claimed is:

1. A process for manufacturing a premold type semiconductor package comprising the following steps of:

inserting a lead frame between first and second molds at their open position, said lead frame comprising a stage and plurality of leads, said first and second molds having recesses which cooperatingly define a cavity therebetween when they are in their closed position, said first mold having a protruded portion which is in contact with a first surface of said lead frame in a closed position, and said second mold having a plurality of pins projected into said cavity, said pins being in contact with a second surface of the respective leads of said lead frame at positions offset from said protruded portion of the first mold while in the closed position;

bringing said first and second molds to their closed position so that said lead frame is nipped therebetween;

injecting resin into said cavity to form a mold resin integrally molded with said lead frame; and cutting respective leads of said lead frame extending outward from said mold resin;

to thereby obtain a package comprising; a plurality of leads cut off from said lead frame, said mold resin integrally molded with said leads, said mold resin defining a chip mounting recess on first surfaces of said stage and leads wherein said chip mounting recess is formed by said protruded portion, and said mold resin is provided with a plurality of holes formed by said plurality of pins wherein the plurality of holes expose the respective leads at positions offset from said chip mounting recess, to define holes for external connecting terminals.

2. A process as set forth in claim 1 further comprising a following step of:

forming bumps on said external connecting terminals by filling said plurality of holes with electrically conducting material.

3. A process as set forth in claim 1 further comprising a following step of:

covering outer ends of said leads with electrically insulating material.

4. A process as set forth in claim 1, wherein each of said pins is a tapered pin so that said holes of the package has a tapered shape, a diameter thereof being gradually increased toward a surface of said mold resin.

* * * * *